United States Patent
Glodde et al.

(10) Patent No.: US 9,348,228 B2
(45) Date of Patent: May 24, 2016

(54) ACID-STRIPPABLE SILICON-CONTAINING ANTIREFLECTIVE COATING

(71) Applicant: GLOBALFOUNDRIES INC., Grand Cayman (KY)

(72) Inventors: Martin Glodde, Mahwah, NJ (US); Wu-Song Huang, Brewster, NY (US); Ratnam Sooriyakumaran, San Jose, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 102 days.

(21) Appl. No.: 13/733,182

(22) Filed: Jan. 3, 2013

(65) Prior Publication Data

US 2014/0186774 A1 Jul. 3, 2014

(51) Int. Cl.
G03F 7/09 (2006.01)
G03F 7/075 (2006.01)
G02B 1/111 (2015.01)
G02B 1/11 (2015.01)

(52) U.S. Cl.
CPC ........ *G03F 7/091* (2013.01); *G02B 1/11* (2013.01); *G02B 1/111* (2013.01); *G03F 7/0752* (2013.01); *G03F 7/0755* (2013.01)

(58) Field of Classification Search
None
See application file for complete search history.

(56) References Cited

U.S. PATENT DOCUMENTS

| | | | |
|---|---|---|---|
| 6,110,653 A | 8/2000 | Holmes et al. | |
| 7,838,615 B2 | 11/2010 | Zhong | |
| 7,883,828 B2 | 2/2011 | Allen et al. | |
| 7,910,283 B2 | 3/2011 | Ogihara et al. | |
| 7,939,244 B2 | 5/2011 | Xu et al. | |
| 8,137,893 B2 | 3/2012 | Burns et al. | |
| 2005/0031964 A1* | 2/2005 | Babich et al. | 430/5 |
| 2005/0042538 A1* | 2/2005 | Babich et al. | 430/270.1 |
| 2005/0255410 A1* | 11/2005 | Guerrero et al. | 430/311 |
| 2005/0277058 A1 | 12/2005 | Iwabuchi et al. | |
| 2008/0102400 A1* | 5/2008 | Huang et al. | 430/270.1 |
| 2009/0297784 A1* | 12/2009 | Xu et al. | 428/172 |
| 2010/0075253 A1* | 3/2010 | Kato et al. | 430/281.1 |
| 2010/0252917 A1 | 10/2010 | Karkkainen | |
| 2011/0046257 A1* | 2/2011 | Webster et al. | 522/148 |
| 2011/0079579 A1* | 4/2011 | Allen et al. | 216/38 |
| 2011/0147984 A1 | 6/2011 | Cheng et al. | |
| 2012/0001135 A1 | 1/2012 | Li et al. | |
| 2012/0288795 A1* | 11/2012 | Umezaki et al. | 430/271.1 |

OTHER PUBLICATIONS

Lassig S. et al., "Integrating Dielectric Etching with 193 nm Resists", Solid State Technology, vol. 45, No. 10, pp. 48-54 (Oct. 2002).
Hudson E.A. et al., "Control of Line Edge Roughness for Etching with 193nm Photoresist", Proc. International Symposium on Dry Process, DPS, pp. 253-258 (Nov. 13-14, 2003).
Burns S. et al., "Silicon Containing Polymer in Applications for 193 NM High NA Lithography Processes", Proc. of SPIE, vol. 6153, 61530K, 12 pages (Feb. 19, 2006).
Wei Y. et al., "Performance of Tri-Layer Process Required for 22nm and Beyond", Proc. of SPIE, vol. 7972, 79722L-1, 12 pages (Feb. 27, 2011).
International Search Report/Written Opinion; Apr. 18, 2014; PCT/US2014/010006.

* cited by examiner

*Primary Examiner* — Sin Lee
(74) *Attorney, Agent, or Firm* — Scully, Scott, Murphy & Presser, P.C.

(57) ABSTRACT

A silicon-containing antireflective coating formulation comprising: (i) an aqueous base insoluble organosilicon component having a multiplicity of hydrocarbon groups derivatized with hydroxy groups in the absence of Si—O—C and Si—O—H moieties; (ii) a vinylether component having a multiplicity of vinylether groups; and (iii) a casting solvent. Also disclosed is a method for converting the silicon-containing antireflective coating formulation into a crosslinked silicon-containing antireflective film comprising organosilicon units interconnected by acetal or ketal groups. The method entails (a) coating a substrate with the silicon-containing antireflective coating formulation and (b) heating the coated substrate to a temperature at which crosslinking between the organosilicon silicon component and vinylether component occurs. Further disclosed is a method for patterning an antireflective coating on a substrate using the crosslinked silicon-containing antireflective film in a lithographic patterning process wherein the crosslinked silicon-containing antireflective film is situated between the substrate and a photoresist.

12 Claims, No Drawings

ACID-STRIPPABLE SILICON-CONTAINING ANTIREFLECTIVE COATING

BACKGROUND

The present application relates to antireflective compositions and methods of using the same.

With the introduction of aliphatic polymethacrylate resist polymers in ArF/193 nm photolithography and the decrease of the resist thicknesses due to transparency, and depth of focus reductions at high numerical aperture (NA), the resist pattern itself was found to no longer be a suitable mask for its transfer into the substrate via reactive-ion etch (RIE) processes (e.g., Lassig, S., et al., *Solid State Technology* 45(10), 48-54, 2002; Hudson, E. A., et al., *Proc. Dry Process Int. Symp.* 253-258, 2003). Consequently, the trilayer scheme was introduced in which a Si-containing layer (silicon-containing antireflective coating (SiARC) or Si oxide) is coated/deposited on top of an underlayer/organic planarizing layer (UL/OPL), e.g., Burns, S., et al., *Proc. SPIE* 6153, 61530K-1-61530K-12 (2006). These layers have alternating selectivity towards fluorine and oxygen-containing RIE chemistry, and therefore, allow for highly selective pattern transfer from the aliphatic photoresist pattern on top of the SiARC into the substrate below the UL. Lastly, the OPL/SiARC layer combination has played an important role for reflectivity control in high NA optical lithography applications.

An important function of the SiARC is their excellent etch resistance against oxide-containing etch chemistry, which enables them to act as an etch mask to transfer the pattern into the OPL. As SiARCs are typically based on organo-functionalized silanols that crosslink to form a silyl-ether network, this etch resistance depends on the content of silicon in these materials: earlier generation SiARCs contained only 17% Si, while most SiARCs used for ArFi trilayer stacks contain 43% Si. Generally, the more Si in the SiARC, the better its etch resistance. The reason for the good etch resistance against oxygen-containing etch chemistry is believed to be due to the non-volatility of $SiO_2$ that typically forms a protection layer around the bulk of the SiARC during the $O_2$-containing OPL open etch. Due to the silyl-ether networks in these SiARCs, these SiARCs are not easily strippable.

The non-volatility of $SiO_2$ limits the options to remove the SiARC during wafer rework processes. Most often, since $SiF_4$ is volatile, aqueous HF or F-containing dry etch chemistry ($CF_4$, $CHF_3$, etc.) are used. However, both HF and $C_xF_y$ species not only react with the SiARC but also with substrate materials like silicon oxide, silicon nitride, or in case of $C_xF_y$, also with Si.

Another option to remove SiARCs using wet chemistry is based on formulations of tetraalkylammonium hydroxides, typically tetramethylammonium hydroxide (TMAH), in mixtures of organic solvents and water. Typically, TMAH concentrations greater than 1 wt % are being used. For SiARCs with 43% Si, even greater than 5 wt % TMAH can be used. These high concentrations of TMAH not only bring the risk of substrate damage (highly concentrated TMAH also dissolves Si) but also raise significant toxicity concerns, particularly if organic solvents (e.g., dimethyl sulfoxide, i.e., DMSO) are used that facilitate the transport of organic material into the human body.

SiARCs with very low Si content (17%) can sometimes be wet stripped with "piranha acid" (conc. $H_2SO_4$+30% $H_2O_2$). As some integration schemes use titanium oxide or nitride as substrates, these can also react/dissolve with such, as $H_2O_2$ forms a soluble peroxo complex.

SUMMARY

The present application is directed to a SiARC formulation, the resulting crosslinked SiARC, methods for using the SiARC formulation to produce a crosslinked SiARC on a substrate, as well as a method for patterning an antireflective coating on a substrate using the crosslinked SiARC in a lithographic patterning process wherein the SiARC is situated between the substrate and a photoresist. By virtue of hydrolyzable acetal or ketal crosslinks contained in the crosslinked SiARC, the crosslinked SiARC is particularly advantageous by being reworkable under significantly milder conditions than known in the art. In particular embodiments, the SiARC described herein can be facilely removed (etched) by contact with an aqueous acid solution. The milder etch conditions advantageously avoid damage to the substrate and provide a safer alternative, from a health and environmental perspective, to SiARC etchants of the art.

The SiARC formulation, as herein described, includes (i) an aqueous base insoluble organosilicon component having a multiplicity of hydrocarbon groups derivatized with hydroxy groups in the absence of Si—O—C and Si—O—H moieties; (ii) a vinylether component having a multiplicity of vinylether groups; and (iii) a casting solvent. In some embodiments, the SiARC formulation further includes an activatable acid generator, particularly a thermal acid generator.

In particular embodiments, the method for producing a crosslinked SiARC on a substrate includes: (a) coating a substrate with a SiARC formulation that includes (i) an aqueous base insoluble organosilicon component having a multiplicity of hydrocarbon groups derivatized with hydroxy groups in the absence of Si—O—C and Si—O—H moieties; (ii) a vinylether component having a multiplicity of vinylether groups; and (iii) a casting solvent; and (b) heating the coated substrate to a temperature at which crosslinking between the organosilicon component and vinylether component occurs to form a crosslinked SiARC that includes organosilicon units interconnected by acetal or ketal groups.

In particular embodiments, the method for patterning an antireflective coating on a substrate includes: (i) applying a photoresist layer over a crosslinked SiARC covering a substrate, wherein the crosslinked SiARC includes aqueous base insoluble organosilicon units interconnected by acetal or ketal groups; (ii) pattern-wise exposing the photoresist layer to form a latent image; (iii) developing the latent image to form a patterned photoresist layer having a relief image therein; (iv) transferring the relief image to the substrate; and (V) removing the crosslinked SiARC by contacting the crosslinked SiARC with an aqueous acid solution in the absence of peroxides and fluorides.

DETAILED DESCRIPTION OF PARTICULAR EMBODIMENTS

The term "hydrocarbon group" (also designated as the group "R"), as used herein, refers, in a first embodiment, to a chemical group composed solely of carbon and hydrogen. In different embodiments, one or more of the hydrocarbon groups can contain precisely, at least, greater than, up to, or less than, for example, one, two, three, four, five, six, seven, eight, nine, ten, eleven, twelve, thirteen, fourteen, fifteen, sixteen, seventeen, or eighteen carbon atoms, or a particular range of carbon atoms bounded by any two of the foregoing carbon numbers.

The hydrocarbon group R can be, for example, saturated and straight-chained (i.e., straight-chained alkyl groups). Some examples of straight-chained alkyl groups include methyl, ethyl, n-propyl, n-butyl, n-pentyl, n-hexyl, n-heptyl, n-octyl, n-nonyl, n-decyl, n-undecyl, n-dodecyl, n-tridecyl, n-tetradecyl, and n-hexadecyl groups.

The hydrocarbon group R can alternatively be saturated and branched (i.e., branched alkyl groups). Some examples of branched alkyl groups include isopropyl, isobutyl, sec-butyl, t-butyl, isopentyl, neopentyl, 2-methylpentyl, 3-methylpentyl, and the numerous $C_7$, $C_8$, $C_9$, $C_{10}$, $C_{11}$, $C_{12}$, $C_{13}$, $C_{14}$, $C_{15}$, and $C_{16}$ saturated and branched hydrocarbon groups.

The hydrocarbon group R can alternatively be saturated and cyclic (i.e., cycloalkyl groups). Some examples of cycloalkyl groups include cyclopropyl, cyclobutyl, cyclopentyl, cyclohexyl, cycloheptyl, and cyclooctyl groups. The cycloalkyl group can also be a polycyclic (e.g., bicyclic or tricyclic) group by either possessing a bond between two ring groups (e.g., dicyclohexyl), or a shared (i.e., fused) side (e.g., decalin), or a bridging unit (e.g., norbornane).

The hydrocarbon group R can alternatively be unsaturated and straight-chained (i.e., straight-chained olefinic or alkenyl groups). Some examples of straight-chained olefinic groups include vinyl, 2-propen-1-yl, 3-buten-1-yl, 2-buten-1-yl, butadienyl, 4-penten-1-yl, 3-penten-1-yl, 2-penten-1-yl, 2,4-pentadien-1-yl, 5-hexen-1-yl, 4-hexen-1-yl, 3-hexen-1-yl, 3,5-hexadien-1-yl, 1,3,5-hexatrien-1-yl, 6-hepten-1-yl, ethynyl, propargyl (2-propynyl), and the numerous $C_7$, $C_8$, $C_9$, $C_{19}$, $C_{11}$, $C_{12}$, $C_{13}$, $C_{14}$, $C_{15}$, and $C_{16}$ unsaturated and straight-chained hydrocarbon groups.

The hydrocarbon group R can alternatively be unsaturated and branched (i.e., branched olefinic or alkenyl groups). Some examples of branched olefinic groups include 2-propen-2-yl, 3-buten-2-yl, 3-buten-3-yl, 4-penten-2-yl, 4-penten-3-yl, 3-penten-2-yl, 3-penten-3-yl, 2,4-pentadien-3-yl, and the numerous $C_6$, $C_7$, $C_8$, $C_9$, $C_{10}$, $C_{11}$, $C_{12}$, $C_{13}$, $C_{14}$, $C_{15}$, and $C_{16}$ unsaturated and branched hydrocarbon groups.

The hydrocarbon group R can alternatively be unsaturated and cyclic (i.e., cycloalkenyl groups or cycloalkenylene linkers). Some examples of unsaturated and cyclic hydrocarbon groups include cyclopropenyl, cyclobutenyl, cyclopentenyl, cyclopentadienyl, cyclohexenyl, cyclohexadienyl, phenyl, benzyl, cycloheptenyl, cycloheptadienyl, cyclooctenyl, cyclooctadienyl, and cyclooctatetraenyl groups. The unsaturated cyclic hydrocarbon group can also be a polycyclic (e.g., bicyclic or tricyclic) group by either possessing a bond between two of the ring groups (e.g., biphenyl) or a shared (i.e., fused) side (e.g., naphthalene, anthracene, and phenanthrene).

The hydrocarbon group R may or may not also include one or more heteroatoms, such as one or more oxygen, nitrogen, sulfur, halogen, and/or silicon atoms. Some particular examples of oxygen-containing groups include those of formula —OR' wherein R' is a hydrogen atom or a hydrocarbon group that optionally contains one or more heteroatoms selected from oxygen, nitrogen, sulfur, halogen, and/or silicon atoms. Other oxygen-containing groups include carbonyl groups (e.g., ketone, aldehyde, ester, amide, or urea functionalities). The —XR' group can also be a polyalkyleneoxide group, such as a polyethyleneoxide group. Some particular examples of nitrogen-containing groups include those of formula —NR'R" wherein R' and R" are each independently a hydrogen atom or hydrocarbon group optionally containing one or more heteroatoms selected from oxygen, nitrogen, sulfur, halogen, and/or silicon atoms. In addition, the nitrogen-containing groups can be primary amine groups, secondary amine groups, tertiary amine groups, or quaternary ammonium groups, wherein it is understood that a quaternary ammonium group necessarily possesses a positive charge that requires a counteranion. Some other nitrogen-containing groups may include cyanide, carboxamide (i.e., —C(O)NR'$_2$, wherein R' is independently selected from hydrogen atom and hydrocarbon group), nitro group, urea group, and carbamate group. Some examples of sulfur-containing groups include the thioether (i.e., sulfide or —SR'), disulfide, sulfoxide, sulfone, sulfonate, and sulfate groups. Halogen atoms considered herein include fluorine, chlorine, bromine, and iodine. Some examples of fluorine-containing hydrocarbon groups (i.e., fluorocarbon groups) include the partially-substituted varieties (e.g., fluoromethyl, difluoromethyl, 2-fluoroethyl, 2,2-difluoroethyl, 2,2,2-trifluoroethyl, and the like) and perfluoro-substituted varieties (e.g., perfluoromethyl, perfluoroethyl, perfluoropropyl, perfluorobutyl, and the like).

The hydrocarbon group R can also include a ring structure (e.g., a monocyclic ring or polycyclic ring system) that contains one or more (e.g., one, two, three, or four) ring nitrogen atoms. The nitrogen-containing rings can be, for example, saturated monocyclic, saturated polycyclic, unsaturated monocyclic, or unsaturated polycyclic. In one embodiment, the nitrogen-containing ring groups or ring systems can also include other ring heteroatoms, such as oxygen or sulfur atoms. In another embodiment, the nitrogen-containing ring groups or ring systems exclude other ring heteroatoms. Some examples of saturated monocyclic nitrogen-containing ring groups include pyrrolidine, piperidine, piperazine, and morpholine groups. Some examples of unsaturated monocyclic nitrogen-containing ring groups include pyrrole, imidazole, pyrazole, pyridine, pyrazine, 1,3,5-triazine, pyrimidine, oxazole, thiazole, and thiazine groups. Some examples of saturated polycyclic nitrogen-containing ring systems include decahydroquinoline and decahydro-1,8-naphthyridine groups. Some examples of unsaturated polycyclic nitrogen-containing ring systems include indole, purine, benzimidazole, 4,4'-bipyridine, 2,2'-bipyridine, 1,8-naphthyridine, quinoline, quinazoline, phenazine, benzoxazole, benzothiazole, 2-phenylpyridine, 2,6-diphenylpyridine, and benzothiazine groups.

The hydrocarbon group R can also include a ring structure that contains one or more (e.g., one, two, three, or four) ring oxygen atoms. The oxygen-containing rings can be, for example, saturated monocyclic, saturated polycyclic, unsaturated monocyclic, or unsaturated polycyclic. In one embodiment, the oxygen-containing ring groups or ring systems can also include other ring heteroatoms, such as nitrogen or sulfur atoms. In another embodiment, the oxygen-containing ring groups or ring systems exclude other ring heteroatoms. Some examples of saturated monocyclic oxygen-containing ring groups include tetrahydrofuran, tetrahydropyran, 1,4-dioxane, 1,3-dioxane, 1,3-dioxolane, and 1,4-oxathiane groups. Some examples of unsaturated monocyclic oxygen-containing ring groups include furan, pyran, and 1,4-dioxine groups. An example of a saturated polycyclic oxygen-containing ring system includes the octahydro-1-benzopyran group. Some examples of unsaturated polycyclic oxygen-containing ring systems include 1-benzopyran (chromene), 2-benzopyran (isochromene), 2-phenylfuran, 2-phenylpyran, coumarin, and 1,4-benzopyrone (chromone) groups.

The hydrocarbon group R can also include a ring structure that contains one or more (e.g., one, two, three, or four) ring sulfur atoms. The sulfur-containing rings can be, for example, saturated monocyclic, saturated polycyclic, unsaturated monocyclic, or unsaturated polycyclic. In one embodiment, the sulfur-containing ring groups or ring systems can also include other ring heteroatoms, such as nitrogen or oxygen atoms. In another embodiment, the sulfur-containing ring groups or ring systems exclude other ring heteroatoms. Some examples of saturated monocyclic sulfur-containing ring groups include tetrahydrothiofuran, tetrahydrothiopyran, 1,4-dithiane, 1,3-dithiane, 1,2-dithiolane, and 1,4-dithiolane groups. Some examples of unsaturated monocyclic sulfur-containing ring groups include thiophene, thiopyran, and 1,4-dithiine groups. An example of a saturated polycyclic sulfur-containing ring system includes the octahydro-1-benzothiopyran group. Some examples of unsaturated polycyclic sulfur-containing ring systems include 1-thiobenzopyran (thiochromene), 2-benzothiopyran (isothiochromene), 2-phenylthiophene, 2-phenylthiofuran, 2,6-diphenylthiopyran, and thiocoumarin groups.

In some embodiments, any one or more classes or specific types of hydrocarbon groups are excluded from any of the components further described below.

As used herein, the term "about" generally indicates within ±0.5%, 1%, 2%, 5%, or up to ±10% of the indicated value. For example, a molecular weight of about 1000 g/mole generally indicates in its broadest sense 1000 g/mole±10%, which indicates 900-1100 g/mole. In addition, the term "about" can indicate either a measurement error (i.e., by limitations in the measurement method), or alternatively, a variation or average in a physical characteristic of a group (e.g., a range of molecular weights).

In one aspect, the instant application is directed to a formulation for producing a silicon-containing antireflective coating (SiARC). The SiARC formulation includes (i) an organosilicon component having a multiplicity of hydrocarbon groups derivatized with hydroxy groups; (ii) a vinylether component having a multiplicity of vinylether groups; and (iii) a casting solvent. Components (i) and (ii) can be in any suitable weight percentage with respect to the total weight of components (i) and (ii). In different embodiments, component (i) or (ii) can be in a weight percentage of precisely, about, at least, above, up to, or less than, for example, 1, 2, 5, 10, 12, 15, 18, 20, 22, 25, 28, 30, 32, 35, 38, 40, 45, 50, 55, 60, 65, 70, 75, 80, 85, 90, 95, 98, or 99 wt % relative to the total weight of components (i) and (ii).

The aqueous base insoluble organosilicon component can be any compound, oligomer, or polymer that includes silicon-carbon bonds (which may include, more particularly, silicon-carbon-silicon moieties), and/or silicon-oxygen-silicon moieties, and which also includes a multiplicity (i.e., at least 2, 3, 4, 5, 6, 7, 8, 9, 10, 20, 30, or more) of hydrocarbon groups that contain at least one hydroxy group. The hydrocarbon group that contains at least one hydroxy group may contain one, two, three, or more hydroxy groups. In typical embodiments, since formation of Si—O—Si moieties is herein preferably avoided during crosslinking (curing), the organosilicon component excludes groups that can be hydrolyzed under acidic conditions, such as silicon-oxygen-carbon (Si—O—C) and silicon-oxygen-hydrogen (Si—O—H) moieties. In particular embodiments, at least a portion of the hydroxy-containing hydrocarbon groups are hydroxyaromatic or hydroxyheteroaromatic groups, such as phenolic, cresol, hydroxynaphthyl, or hydroxypyridyl groups. In other particular embodiments, at least a portion of the hydroxy-containing hydrocarbon groups are alkylhydroxy groups. In yet other particular embodiments, at least a portion of the hydroxy-containing hydrocarbon groups are cycloalkylhydroxy groups, wherein the cycloalkyl group can be a monocycloalkyl group (e.g., cyclopentyl or cyclohexyl), a bicycloalkyl group (e.g., decalinyl), or a tricycloalkyl group (e.g., norbornyl). The aqueous base insoluble organosilicon component is not soluble in a typical aqueous base developer used in the semiconductor industry in developing photoresist images. A typical aqueous base developer is 0.263N TMAH developer.

In some embodiments, the aqueous base insoluble organosilicon component may contain acidic groups covalently bound therein, such as carboxylic acid, sulfonic acid, or phosphonic acid groups, while in other embodiments, the aqueous base insoluble organosilicon component does not include acidic groups. In other embodiments, the aqueous base insoluble organosilicon component may include organoester groups (i.e., —OC(O)R or —C(O)OR groups), while in other embodiments, the aqueous base insoluble organosilicon component does not include organoester groups. In other embodiments, the aqueous base insoluble organosilicon component contains halogenated (e.g., fluorinated) hydrocarbon groups, while in other embodiments, the aqueous base insoluble organosilicon component does not include hydrogenated or fluorinated hydrocarbon groups.

In particular embodiments, the aqueous base insoluble organosilicon component is a carbosilane polymer (i.e., polycarbosilane) that includes a multiplicity of hydrocarbon groups derivatized with hydroxy groups. The polycarbosilanes can be any of the polycarbosilanes known in the art (as described, for example, in U.S. Pat. No. 7,883,828), except that they have been modified to include a multiplicity of hydrocarbon groups derivatized with hydroxy groups. The polycarbosilane can, for example, have a structure according to the following formula:

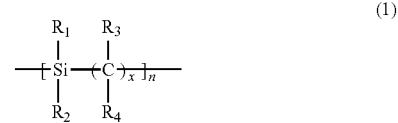

(1)

In Formula (1), $R_1$ and $R_2$ are independently selected from hydrogen atom (H), hydrocarbon groups (R), and —O—Si—R groups. Groups $R_3$ and $R_4$ are independently selected from hydrogen atom, hydrocarbon groups (R), and ether groups (OR). At least a portion of the R groups in the polycarbosilane derivative are substituted with one or more hydroxy groups. The subscript x is at least 1, typically 1, 2, 3, or 4. The subscript n is greater than 1, such as 2, 3, 4, 5, 10, 15, 20, 25, 30, 35, 40, 45, 50, 55, 60, 65, 70, 75, 80, 85, 90, 95, or 100, or a value within a range bounded by any two of the foregoing exemplary values. Alternatively, the value of n corresponds to a weight-average molecular weight ($MW_{av}$) of the polycarbosilane of precisely, about, at least, above, up to, or less than, for example, 500, 600, 700, 800, 900, 1000, 1200, 1500, 1800, 2000, 2200, 2500, 2800, 3000, 3200, 3500, 3800, 4000, 4200, 4500, 4800, or 5000 g/mole. In some embodiments, the polycarbosilane is a polycarbomethylsilane by selecting at least one or both of $R_1$ and $R_2$ as methyl groups. In some embodiments, at least one or both of $R_1$ and $R_2$ are hydrogen atoms, while in other embodiments, none of $R_1$ and $R_2$ are hydrogen atoms. In particular embodiments, one or both of $R_3$ and $R_4$ are hydrogen atoms. Significantly, the $R_1$, $R_2$, $R_3$, and $R_4$ groups subtended by n may be the same or different across different polymer units subtended by n. Moreover, any of the $R_1$, $R_2$, $R_3$, and $R_4$ groups, when designated as a hydrocarbon group R or OR group, can be independently and optionally substituted with one or more heteroatoms selected from O, N, S, halogen, and Si.

In particular embodiments of Formula (1), the aqueous base insoluble organosilicon component is a polycarbomethylsilane having the following formula:

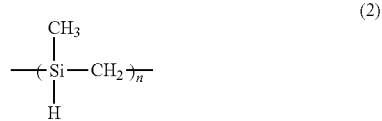
(2)

In Formula (2) above, n is greater than 1, 2, or 3, and can be, for example, at least, above, or up to 5, 10, 20, 30, 40, 50, 100, 200, 300, 400, 500, or 1000, or within a range bounded by any two of these values. The polycarbosilane can be derivatized with hydroxy-containing hydrocarbon groups by means generally known in the art. For example, a polycarbomethylsilane may be derivatized with hydroxy-containing hydrocarbon groups by the following general scheme:

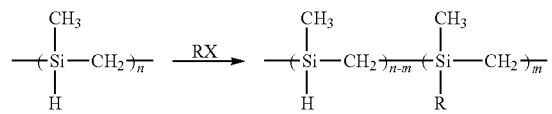

In the above scheme, R is a hydrocarbon group that contains one or more hydroxy groups, and X is a group reactive with a silyl hydride. The subscript m may be any of the values provided above for n. The units subtended by m, which contains the hydroxy-containing hydrocarbon group, may be any percentage of the polymer, wherein the sum of n and m corresponds to 100% of the polymer. In different embodiments, m is precisely, about, at least, or greater than, for example, 5%, 10%, 15%, 20%, 25%, 30%, 35%, 40%, 45%, 50%, 55%, 60%, 65%, 70%, 75%, 80%, 85%, 90%, 95%, or even 100%, which corresponds to n being 0.

In other embodiments, the aqueous base insoluble organosilicon component is a polysiloxane derivative. The polysiloxane derivative contains at least one Si—O—Si moiety and a multiplicity of hydroxy-containing hydrocarbon groups. Generally, the polysiloxane does not contain Si—O—C or Si—O—H moieties. The polysiloxane may have precisely, at least, greater than, or up to, for example, 1, 2, 5, 10, 15, 20, 25, 30, 35, 40, 50, 60, 70, 80, 90, or 100 Si—O—Si groups, and a MW corresponding to any of the MWs provided above for the polycarbosilanes. In one set of embodiments, the polysiloxane is a linear siloxane, such a disiloxane, trisiloxane, tetrasiloxane, pentasiloxane, hexasiloxane, heptasiloxane, octasiloxane, nonasiloxane, decasiloxane, or a higher siloxane. In another set of embodiments, the polysiloxane is a cyclic siloxane, such as cyclotrisiloxane, cyclotetrasiloxane, cyclopentasiloxane, cyclohexasiloxane, cycloheptasiloxane, or cyclooctasiloxane. In yet another set of embodiments, the polysiloxane is a silsesquioxane, which may be a cage or partial cage silsesquioxane. In further embodiments, the silsesquioxane is a polyhedral oligomeric silsesquioxane (POSS). In particular embodiments, the POSS derivative can be represented by the following structure:

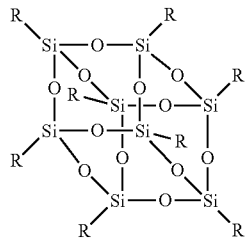
(3)

wherein the R groups in the above silsesquioxane formula are typically hydrocarbon groups, at least a portion (or all) of which contain hydroxy groups.

The aqueous base insoluble organosilicon component can have any suitable silicon weight percentage (Si wt %). In different embodiments, the organosilicon component has a Si wt % of precisely, about, at least, or above, for example, 10, 15, 20, 25, 30, 35, 40, 45, or 50 wt %.

The vinylether component can be any compound, oligomer, or polymer that includes a multiplicity (i.e., at least 2, 3, 4, 5, 6, 7, 8, 9, 10, 20, 30, or more) of vinyl ether groups, wherein the vinyl ether groups can be conveniently represented by the formula —O—CR$_5$=C(R$_6$)(R$_7$), wherein R$_5$, R$_6$, and R$_7$ are independently selected from hydrogen atom and hydrocarbon groups (R) described above. In typical embodiments, R$_5$, R$_6$, and R$_7$ are all hydrogen atoms. However, in some embodiments, one, two, or all three of R$_5$, R$_6$, and R$_7$ are hydrocarbon groups, such as methyl groups. When R$_5$ is a hydrogen atom, then reaction of the vinyl ether group with the hydroxyl group of the organosilicon component results in an acetal linkage. When R$_5$ is a hydrocarbon group, then reaction of the vinyl ether group with the hydroxyl group of the organosilicon component results in a ketal linkage. In different embodiments, the molecular weight of the vinylether component can be precisely, about, at least, above, up to, or less than, for example, 250, 500, 600, 700, 800, 900, 1000, 1200, 1500, 1800, 2000, 2200, 2500, 2800, 3000, 3200, 3500, 3800, 4000, 4200, 4500, 4800, or 5000 g/mole.

In one set of embodiments, the vinylether component contains only carbon, oxygen, and hydrogen atoms, which can be any of the hydrocarbon groups R described above modified to include at least two vinyl ether groups of the formula —O—CR$_5$=C(R$_6$)(R$_7$), as described above. In other embodiments, the vinylether component may or may not include one or more other heteroatoms, such as one or more nitrogen, sulfur, halogen, or silicon atoms.

In a first exemplary embodiment, the vinylether component contains two or more vinyl ether groups linked by one or more alkylene linkages. In particular embodiments, the alkylene-linked vinylether component has the following structural formula:

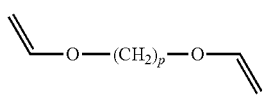
(4)

In Formula (4) above, the subscript p can be an integer above 0, such as, for example, 1, 2, 3, 4, 5, 6, 7, 8, 9, 10, 11, or 12. Some examples of divinylether compounds according to Formula (4) include 1,2-bis(vinyloxy)ethane, 1,2-bis(vinyloxy)propane, 1,3-bis(vinyloxy)propane, 1,2-bis(vinyloxy)butane, 1,3-bis(vinyloxy)butane, 1,4-bis(vinyloxy)butane, 1,5-bis(vinyloxy)pentane, 1,6-bis(vinyloxy)hexane, 1,7-bis(vinyloxy)heptane, and 1,8-bis(vinyloxy)octane. In some embodiments, one or more hydrogen atoms of the alkylene linker are substituted with hydrocarbon groups (R), such as methyl, ethyl, methoxy, or ethoxy. One or more hydrogen atoms of the alkylene linker may alternatively be substituted by one or more additional vinyl ether groups, or by one or more vinyl ether groups linked to the alkylene linker by an additional alkylene linker.

In a second exemplary embodiment, the vinylether component contains two or more vinyl ether groups linked by a dicarboxylate moiety. In particular embodiments, the dicarboxylate-linked vinylether component has the following structural formula:

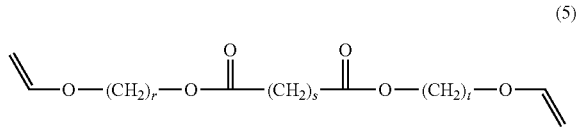
(5)

In Formula (5) above, r, s, and t can be, independently, an integer above 0, such as, for example, 1, 2, 3, 4, 5, 6, 7, 8, 9, 10, 11, or 12. Some examples of vinylether compounds according to Formula (5) include bis-[(vinyloxy)methyl]malonate (r=s=t=1), bis-[2-(vinyloxy)ethyl]malonate (r=t=2, s=1), bis-[3-(vinyloxy)propyl]malonate (r=t=3, s=1), bis-[4-(vinyloxy)butyl]malonate (r=t=4, s=1), bis-[(vinyloxy)methyl]succinate (r=t=1, s=2), bis-[2-(vinyloxy)ethyl]succinate (r=t=s=2), bis-[3-(vinyloxy)propyl]succinate (r=t=3, s=2), bis-[4-(vinyloxy)butyl]succinate (r=t=4, s=2), bis-[5-(vinyloxy)pentyl]succinate (r=t=5, s=2), bis-[6-(vinyloxy)hexyl]succinate (r=t=6, s=2), bis-[(vinyloxy)methyl]glutarate (r=t=1, s=3), bis-[2-(vinyloxy)ethyl]glutarate (r=t=2, s=3), bis-[3-(vinyloxy)propyl]glutarate (r=t=s=3), bis-[4-(vinyloxy)butyl]glutarate (r=t=4, s=3), bis-[5-(vinyloxy)pentyl]glutarate (r=t=5, s=3), bis-[6-(vinyloxy)hexyl]glutarate (r=t=6, s=3), bis-[(vinyloxy)methyl]adipate (r=t=1, s=4), bis-[2-(vinyloxy)ethyl]adipate (r=t=2, s=4), bis-[3-(vinyloxy)propyl]adipate (r=t=3, s=4), bis-[4-(vinyloxy)butyl]adipate (r=t=s=4), bis-[5-(vinyloxy)pentyl]adipate (r=t=5, s=4), bis-[6-(vinyloxy)hexyl]adipate (r=t=6, s=4), bis-[(vinyloxy)methyl]pimelate (r=t=1, s=5), bis-[2-(vinyloxy)ethyl]pimelate (r=t=2, s=5), bis-[3-(vinyloxy)propyl]pimelate (r=t=3, s=5), bis-[4-(vinyloxy)butyl]pimelate (r=t=4, s=5), bis-[5-(vinyloxy)pentyl]pimelate (r=t=s=5), bis-[6-(vinyloxy)hexyl]pimelate (r=t=6, s=5), bis-[(vinyloxy)methyl]suberate (r=t=1, s=6), bis-[2-(vinyloxy)ethyl]suberate (r=t=2, s=6), bis-[3-(vinyloxy)propyl]suberate (r=t=3, s=6), bis-[4-(vinyloxy)butyl]suberate (r=t=4, s=6), bis-[5-(vinyloxy)pentyl]suberate (r=t=5, s=6), and [6-(vinyloxy)hexyl]suberate (r=t=s=6). Moreover, any one or more of the hydrogen atoms of the dicarboxylate linker (i.e., as subtended by s) may or may not be substituted by a hydrocarbon group (R), which may include another carboxylate linking group connected to another vinyl ether group via an alkylene linker. Thus, Formula (5) may also include tris-(vinyloxy) and tetrakis-(vinyloxy) derivatives as derived from a tricarboxylate (e.g., citrate, isocitrate, aconitate, or propane-1,2,3-tricarboxylate) or a tetracarboxylate (e.g., EDTA), respectively.

In a third exemplary embodiment, the vinylether component contains two or more vinyl ether groups linked by an alkylene ether moiety. In particular embodiments, the alkylene ether-linked vinylether component has the following structural formula:

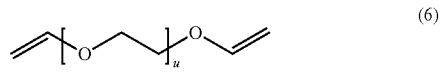
(6)

In Formula (6) above, the subscript u can be an integer of at least 2, such as, for example, 2, 3, 4, 5, 6, 7, 8, 9, 10, 11, or 12. Moreover, any one or more of the hydrogen atoms of the alkylene oxide linker may or may not be substituted by a hydrocarbon group (R).

In a fourth exemplary embodiment, the vinylether component contains two or more vinyl ether groups linked to a one or more hydrocarbon rings, wherein the hydrocarbon ring may be a saturated or unsaturated (e.g., aromatic) ring. The hydrocarbon ring may or may not include one or more ring heteroatoms, thus resulting in, for example, a heterocycloalkyl or heteroaryl ring. In particular embodiments, the ring-linked vinylether component is a phenylene-linked vinyl ether component, which can be conveniently represented by the following structural formula:

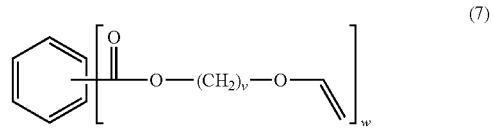
(7)

In Formula (7) above, the subscript v can be an integer above 0, such as, for example, 1, 2, 3, 4, 5, 6, 7, 8, 9, 10, 11, or 12. Moreover, any one or more of the hydrogen atoms of the alkylene linker and/or the phenylene ring may or may not be substituted by a hydrocarbon group (R). The subscript w can be an integer of at least 2, such as, for example, 2, 3, 4, 5, or 6. Some examples of compounds of Formula (7) when w is 2 (i.e., divinyl ether) include bis-[2-(vinyloxy)ethyl]phthalate, bis-[2-(vinyloxy)ethyl]isophthalate, bis-[2-(vinyloxy)ethyl]terephthalate, bis-[3-(vinyloxy)propyl]phthalate, bis-[3-(vinyloxy)propyl]isophthalate, bis-[3-(vinyloxy)propyl]terephthalate, bis-[4-(vinyloxy)butyl]phthalate, bis-[4-(vinyloxy)butyl]isophthalate, bis-[4-(vinyloxy)butyl]terephthalate, bis-[5-(vinyloxy)pentyl]phthalate, bis-[5-(vinyloxy)pentyl]isophthalate, bis-[5-(vinyloxy)pentyl]terephthalate, bis-[6-(vinyloxy)hexyl]phthalate, bis-[6-(vinyloxy)hexyl]isophthalate, and bis-[6-(vinyloxy)hexyl]terephthalate. Some examples of compounds of Formula (7) when w is 3 (i.e., trivinyl ether) include tris-[2-(vinyloxy)ethyl]-1,3,5-benzenetricarboxylate (i.e., tris-[2-(vinyloxy)ethyl]trimesate), tris-[3-(vinyloxy)propyl]-1,3,5-benzenetricarboxylate, tris-[4-(vinyloxy)butyl]-1,3,5-benzenetricarboxylate, tris-[5-(vinyloxy)pentyl]-1,3,5-benzenetricarboxylate, tris-[6-(vinyloxy)hexyl]-1,3,5-benzenetricarboxylate, tris-[2-(vinyloxy)ethyl]-1,2,4-benzenetricarboxylate (i.e., tris-[2-(vinyloxy)ethyl]trimellitate), tris-[3-(vinyloxy)propyl]-1,2,4-benzenetricarboxylate, tris-[4-(vinyloxy)butyl]-1,2,4-benzenetricarboxylate, tris-[5-(vinyloxy)pentyl]-1,2,4-benzenetricarboxylate, and tris-[6-(vinyloxy)hexyl]-1,2,4-benzenetricarboxylate. Some examples of compounds of Formula (7) when w is 4 (i.e., tetravinyl ether) include tetrakis-[2-(vinyloxy)ethyl]-1,2,4,5-benzenetetracarboxylate, tetrakis-[3-(vinyloxy)propyl]-1,2,4,5-benzenetetracarboxylate, and tetrakis[4-(vinyloxy)butyl]-1,2,4,5-benzenetetracarboxylate. The benzene ring shown in Formula (7) may also be connected, either directly or through a hydrocarbon linker, to another ring, as is the case for bis[4-(vinyloxy)butyl](methylene-di-4,1-phenylene)biscarbamate.

In a fifth exemplary embodiment, the vinylether component contains two or more vinyl ether groups linked to a silicon-containing moiety (e.g., a silane or siloxane moiety). Some examples of silicon-containing vinyl ether compounds include bis-[2-(vinyloxy)ethyl]dimethylsilane, bis-[3-(vinyloxy)propyl]dimethylsilane, bis-[4-(vinyloxy)butyl]dimethylsilane, tris-[2-(vinyloxy)ethyl]methylsilane, tris-[3-(vinyloxy)propyl]methylsilane, and tris-[4-(vinyloxy)butyl] methylsilane, as well as derivatives of such compounds in which a methyl group or alkylene linker connected to the vinyloxy group are replaced with one or more alkyleneoxy linkages.

In a sixth exemplary embodiment, the vinylether component contains two or more vinyl ether groups linked to a polymeric unit. The polymeric unit can be composed of, for example, carbon and hydrogen, or carbon, oxygen, and hydrogen. The vinylether polymer may, for example, contain two or more vinyl ether pendant groups on a polyvinyl, polyacrylate, polymethacrylate, or polymethylmethacrylate backbone. In some embodiments, the vinylether polymer may also include silicon, and may be any of the silicon-containing polymers or oligomers described above, and modified to include a multiplicity of vinyl ether groups.

In both the aqueous base insoluble silicon-containing component and vinylether component, basic (i.e., alkaline) groups, such as amino groups, are generally excluded because these could interfere with the acidic crosslinking process. Other groups, such as amido, carbamato, ureido, ester, and the like, may be included, as long as they do not interfere with the crosslinking process or final product.

The SiARC formulation also generally includes a casting solvent. The casting solvent can be any solvent known in the art that effectively solubilizes the organosilicon and vinylether components without reacting with the components or interfering in the crosslinking process or patterning process. The solvent can be, for example, any solvent conventionally used in spin coat methods, e.g., ethers, glycol ethers, aromatic hydrocarbons, ketones, and esters commonly used for such a purpose. Some particular examples of casting solvents include 3-pentanone, methyl isobutyl ketone (MIBK), propylene glycol methyl ether (1-methoxy-2-propanol), methyl cellosolve (2-methoxyethanol), butyl acetate, 2-ethoxyethanol, propylene glycol methyl ether acetate (PGMEA), propylene glycol propyl ether (1-propoxy-2-propanol, Dowanol PnP), 4-heptanone, 3-heptanone, 2-heptanone, N,N-dimethylformamide, N,N-dimethylacetamide, anisole, ethyl lactate, cyclohexanone, cellusolve acetate (ethylene glycol ethyl ether acetate), diglyme (2-methoxy ethyl ether), ethoxyethylpropionate (EEP), dimethyl sulfoxide, di(propylene glycol) methyl ether (DOWANOL®), di(ethylene glycol) methyl ether, diethylmalonate, diethylene glycol monobutyl ether (DEGBE) and gamma-butyrolactone (GBL). Moreover, any suitable combination of such solvents may be used, e.g., a combination of EEP and GBL.

The SiARC formulation may also include an activatable acid generator. The activatable acid generator is included in an amount at which a suitable level of crosslinking is provided under the crosslinking conditions used. In different embodiments, the activatable acid generator can be in a weight percentage of precisely, about, at least, above, up to, or less than, for example, 0.1, 0.5, 1, 2, 5, 10, 12, 15, 18, 20, 22, 25, 28, or 30 wt % relative to the total weight of the formulation.

In one embodiment, the activatable acid generator is a thermal acid generator (TAG). The thermal acid generator liberates acid upon thermal treatment. The activated acid generator can also be a weak acid at room temperature, which can become a stronger acid at elevated temperature. Examples of such acids include substituted and unsubstituted benzoic acids, and some di-, tri- or tetra carboxylic acids. Some other examples of thermal acid generators include 2,4,4,6-tetrabromocyclohexadienone, benzoin tosylate, 2-nitrophenyl tosylate, and other alkyl esters of organic sulfonic acids. Compounds that generate a sulfonic acid group upon activation are generally suitable. Other suitable thermally activated acid generators are described in U.S. Pat. Nos. 5,886,102 and 5,939,236, the contents of which are herein incorporated by reference.

Some particular examples of thermal acid generators are provided as follows:

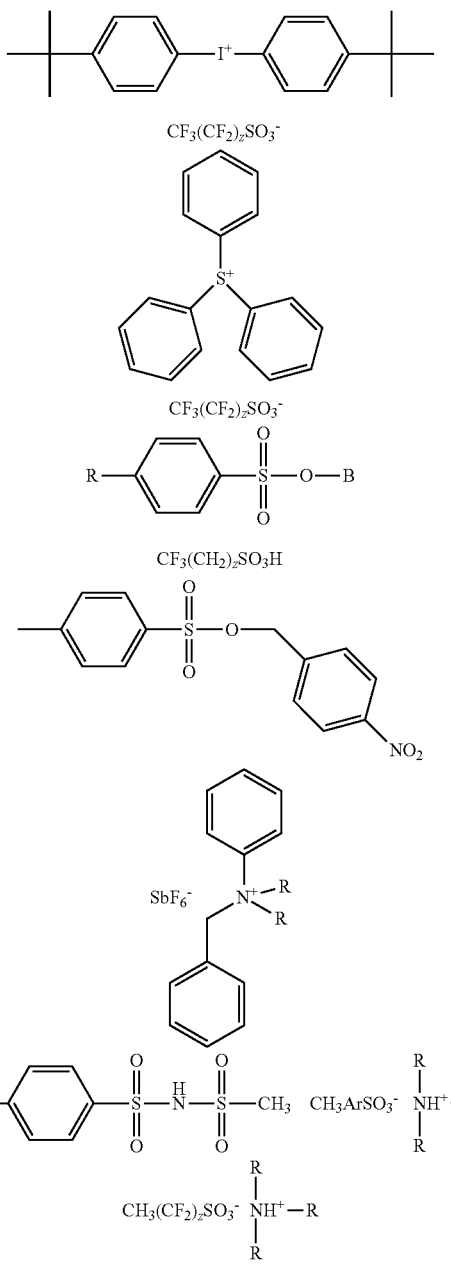

In the above examples of thermal acid generators, R independently represents any of the hydrocarbon groups described above, and the subscript z can be, for example, 0, 1, 2, 3, 4, 5, 6, 7, 8, 9, 10, 11, or 12. The variable B represents a thermal cleavable hydrocarbon group. The variable Ar represents an aromatic (aryl) or heteroaromatic (heteroaryl) ring.

In another embodiment, the activatable acid generator is a photosensitive acid generator (PAG), which may or may not be used in combination with a TAG. The PAG can be, for example, any of the oxazole, iodonium salt, or disulfonic acid compounds known in the art for this purpose, as comprehensively described in U.S. Pat. No. 5,576,143, the contents of which are incorporated herein by reference in their entirety. Some particular PAGs considered herein include (trifluoromethylsulfonyloxy)-bicyclo[2.2.1]hept-5-ene-2,3-dicarboximide (MDT), N-hydroxy-naphthalimide (DDSN), onium salts, aromatic diazonium salts, sulfonium salts, diaryliodonium salts, sulfonic acid esters of N-hydroxyamides, imides, and combinations thereof.

If desired, a radiation-sensitive acid generator may be employed as an alternative to a thermally activated acid generator or in combination with a thermally activated acid generator. Examples of suitable radiation-sensitive acid generators are also described in U.S. Pat. Nos. 5,886,102 and 5,939,236. Other radiation-sensitive acid generators known in the resist art may also be used as long as they are compatible with components of the formulation. Where a radiation-sensitive acid generator is used, the cure (crosslinking) temperature of the composition may be reduced by application of appropriate radiation to induce acid generation which in turn catalyzes the crosslinking reaction. In some embodiments, it may be preferable to use a combination of two or more acid generators.

The SiARC formulation can be produced by any suitable method, such as by combining the components and mixing or blending them until a homogeneous mixture is obtained. In some embodiments, the formulation is provided with all components combined and pre-mixed. In other embodiments, components of the formulation are separately provided for subsequent mixing, typically as a kit. For example, components (i), (ii), and (iii), and optionally, an activatable acid generator, may be separately provided, typically with instructions on how to combine them and use the produced formulation. In other embodiments, (i) and (ii), or (i) and (iii), or (ii) and (iii), optionally with an activatable acid generator, may be provided in mixed form, to be combined with one or more other components of the formulation.

In another aspect, the instant application is directed to a method for producing a crosslinked SiARC on a substrate. The substrate can be any substrate suitable for integration as a platform in electronic and semiconductor devices. For example, the substrate can be composed of, or include, one or more transition metal elements (for example, Groups IIIB, IVB, VB, IB, and IIB of the Periodic Table), one or more main group elements (for example, Groups IIIA, IVA, and VA of the Periodic Table), or combinations thereof, and particularly, oxides, nitrides, phosphides, arsenides, and/or silicides of these elements. Some particular examples of substrates include silicon, silicon dioxide, germanium, germanium oxide, indium oxide, gallium arsenide, glass, fused silica, mica, ceramics, metals deposited on the aforementioned substrates, and combinations thereof. The substrate can also be a plastic or polymeric material. The substrate may comprise a stack or layering of different materials. For a substrate used in a trilayer approach, there may be a comparatively thick organic underlayer and a thin silicon-containing interlayer, wherein the silicon-containing layer may be, for example, a chemical vapor-deposited silicon oxide layer or a spin-coated silsesquioxane polymer film. In particular embodiments, the substrate is a silicon wafer, such as those employed in semiconductor manufacturing. The films and layers described herein may be disposed on top of the substrate or may be integrally joined or incorporated with the substrate.

In the method for producing the crosslinked SiARC on a substrate, the SiARC formulation, described above, is first deposited on a substrate. The SiARC formulation can be deposited by any processes known in the art, such as spin coating, spray coating, dip coating, doctor-blading, roll coating, and the like, which may be used individually or in combination. After being coated, the coating (i.e., generally, the coated substrate) is heated to a curing temperature at which crosslinking between the organosilicon component and vinylether component occurs. The curing temperature may be, for example, 150° C., 160° C., 170° C., 180° C., 190° C., 200° C., 210° C., 220° C., 230° C., 240° C., 250° C., 260° C., 270° C., 280° C., 290° C., or 300° C., or a temperature within a range bounded by any two of the foregoing exemplary temperatures, for a processing time of, for example, 30 seconds, 60 seconds, 1 minute, 2 minutes, 5 minutes, or 10 minutes. Generally, lower temperatures require longer processing times to achieve the degree of crosslinking provided by a higher temperature. Before the coating is cured, the coating may optionally be post-apply baked in order to, for example, remove the solvent. The post-apply bake temperature may be, for example, 50° C., 70° C., 100° C., 110° C., 120° C., 130° C. or 140° C., for a processing time of, for example, 30 seconds, 60 seconds, 1 minute, 2 minutes, 5 minutes, 10 minutes, 30 minutes, or an hour.

The resulting crosslinked SiARC contains aqueous base insoluble organosilicon units (as provided by the aqueous base insoluble organosilicon component) interconnected by acetal or ketal groups, which arise from the reaction of hydroxy groups in the aqueous base insoluble organosilicon component with vinyl ether groups in the vinylether component. Since the vinylether component is also being crosslinked, linking portions found in the vinylether component are also necessarily incorporated into the crosslinked SiARC. Generally, the thickness of the coating or film of the crosslinked SiARC is no more than 200 nm. In different embodiments, the thickness may be precisely, about, up to, or less than, for example, 200, 180, 150, 120, 100, 90, 80, 70, 60, 50, 40, 30, 20, 10, 5, or 1 nm.

The crosslinking process can be further described by the following generic scheme, which shows the formation of acetal linking groups:

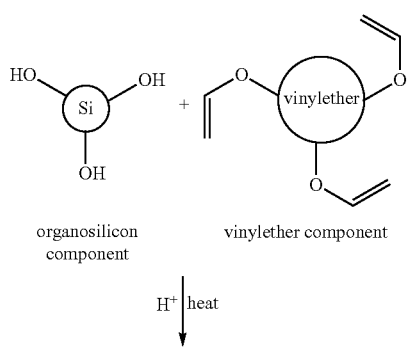

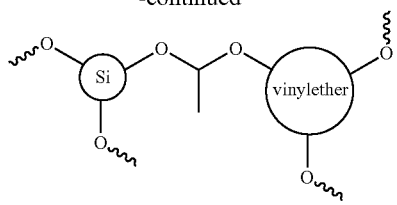

The presence of the acetal (or ketal) linkages advantageously permits the facile hydrolysis and removal of the crosslinked SiARC. A general schematic for the hydrolysis of the crosslinked SiARC is provided as follows:

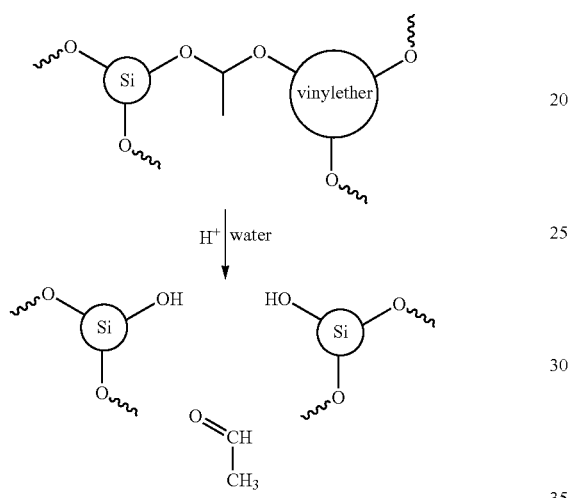

In yet another aspect, the instant application is directed to a method for patterning the above-described crosslinked SiARC on a substrate. In the method, a photoresist film is first deposited on a substrate that has been coated with the crosslinked SiARC. The photoresist film can be deposited by any processes known in the art, such as spin coating, spray coating, dip coating, doctor-blading, roll coating, and the like, which may be used individually or in combination. Typically, after deposition of the photoresist film, the photoresists is post-apply baked at, for example, 90° C., 100° C., 110° C., 120° C., 130° C. or 140° C., for a sufficient period of time, e.g., 30 seconds, or 1, 2, 3, 4, or 5 minutes. The photoresist film can be any of the positive or negative photoresist films known in the art. Depending on the type of photoresist, it may or may not include a thermal or photo-sensitive acid generator.

In some embodiments, the polymer of the photoresist is a homopolymer. In other embodiments, the polymer is a copolymer, i.e., a polymer containing two or more different monomer units. Thus, the term "copolymer" used herein also includes terpolymers, tetrapolymers, and pentapolymers. Furthermore, the copolymer can be in any of several structural arrangements, such as a block copolymer, periodic copolymer, alternating copolymer, graft copolymer, or random copolymer. The polymer or copolymer may also be linear or branched. Alternatively, the polymer of the photoresist may be a blend of two or more polymers, such as blends of two or more of the polymers and/or copolymers described above.

In particular embodiments, the polymer of the photoresist film includes monomers containing a lactone group. At least one benefit of including a lactone monomer is that the lactone may improve dissolution in an aqueous developer. Some examples of lactone monomer groups (named as precursor units before polymerization) include: 5-methacryloyloxy-2,6-norbornanecarbo-γ-lactone, 3-methacryloyloxymethyl-2,6-norbornanecarbolactone, 3-acryloyloxymethyl-2,6-norbornanecarbolactone, α-acryloyloxy-γ-butyrolactone, α-methacryloyloxy-γ-butyrolactone, β-acryloyloxy-γ-butyrolactone, and β-methacryloyloxy-γ-butyrolactone.

Some examples of lactone-containing monomer units include:

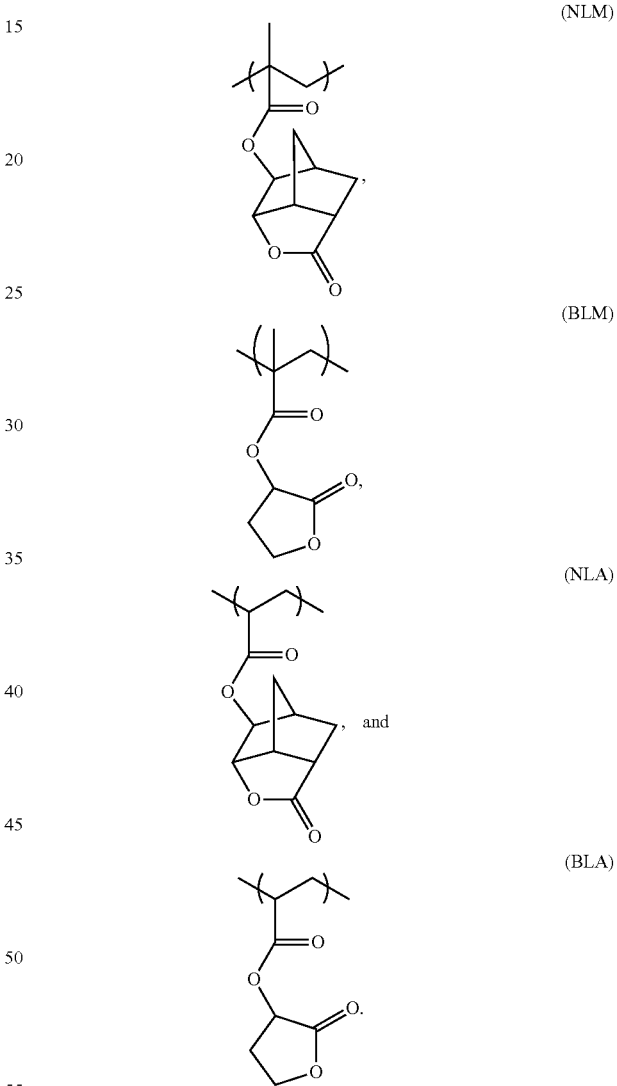

In other embodiments, the resist polymer includes a monomer containing at least one acid labile moiety. In particular embodiments, the acid labile moiety is a tertiary ester group. The tertiary ester groups are generally those that can be deprotected by an acid generated by the photoacid generator. Some examples of tertiary ester moieties include ester derivatives of structural groups such as: methyladamantane, ethyladamantane, methylcyclopentane, ethylcyclopentane, methylcyclohexane, ethylcyclohexane, methylcycloheptane, ethylcyclohepatane, methylcyclooctane, ethylcyclooctane, and t-butyl. Some examples of such monomer units include:

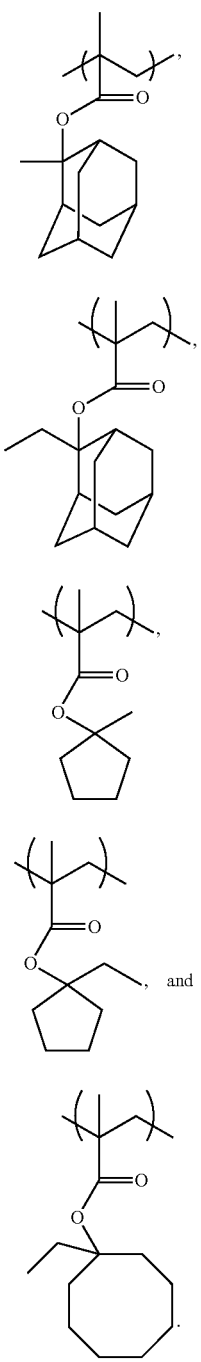

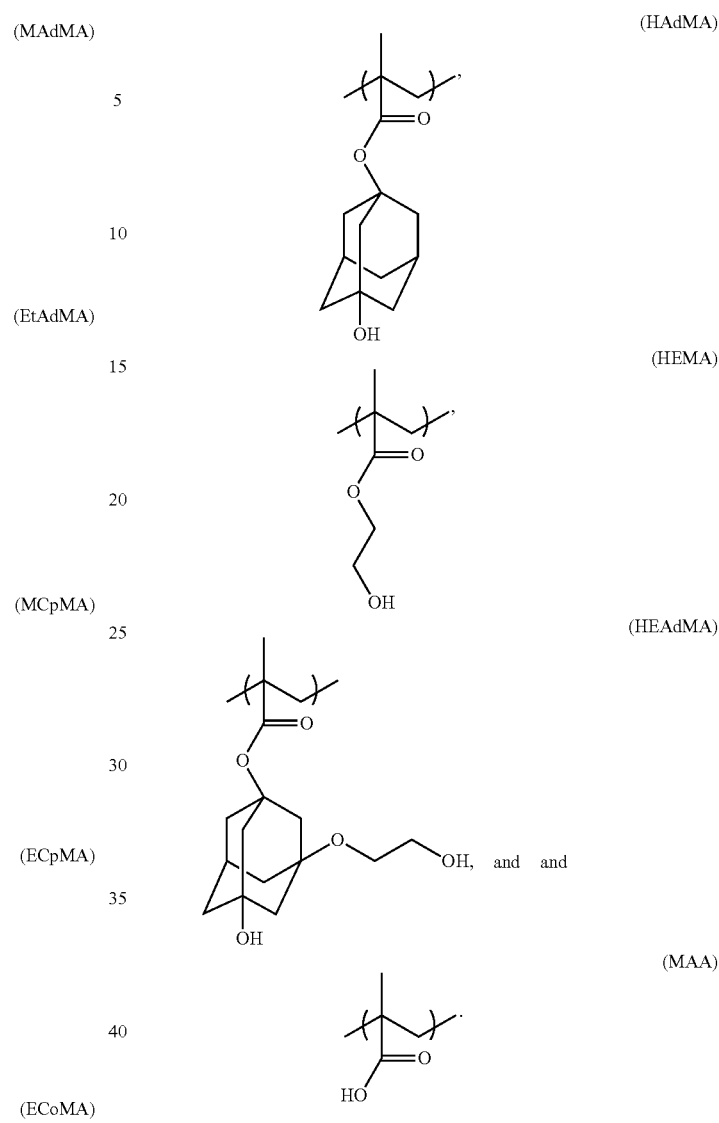

In other embodiments, the polymer includes a monomer bearing one or more hydrophilic groups, such as one or more hydroxy, carboxylic acid, ether, and/or amido groups. Such hydrophilic monomer units may serve to optimize the solubility behavior of the photoresist in the casting solvent. In particular embodiments, the hydrophilic monomer units make the polymer substantially soluble in the casting solvent at a first temperature and substantially insoluble at another higher temperature, such as a high temperature bake. Some particular examples of such monomer units include:

In other embodiments, the polymer includes a monomer unit that stabilizes the photoresist image during the developing process. In particular embodiments, these monomer units contain one or more photoresist-stabilizing groups, such as those selected from sulfonamide, fluorinated sulfonamide, fluoroalcohol, dicarboxylmide, N-hydroxydicarboxylmide, phenol, naphthol, amino, and imino groups. A particular example of these types of monomer units includes:

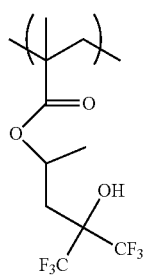

In yet other embodiments, the photoresist may include a polymer that contains epoxide or urethane moieties for base-catalyzed crosslinking after subjecting the photoresist to a temperature above a first temperature, T, followed by baking to render the photoresist film insoluble to the casting solvent. The photoresist may also include amic ester moieties for base-catalyzed imidization, or pendant carboxyl moieties for base-catalyzed decarboxylation, or carbonyl moieties (aldehyde moieties and ketone moieties), or active methylene moieties for base-catalyzed crosslinking through a Knoevenagel reaction.

The photoresist film generally also includes a photoreactive component. The photoreactive component is any compound or polymeric appendage, as known in that art, that decomposes upon irradiation to generate a reactive species that renders the photoresist insoluble (i.e., by crosslinking) or soluble in a developing process, depending on whether a negative or positive photoresist composition is used. In some embodiments, the photoreactive component is a photosensitive acid or base generator. In other embodiments, the photoreactive component is transformed, upon irradiation, into a species that alters the solubility of the photoresist in those regions of photoresist that have been irradiated. Some examples of such photoreactive components include diazonaphthoquinone (DNC), epoxy groups, and hydroxystyrene groups.

The photoresist film may further include one or more thermal base generators. The thermal base generator releases a base at or above an activating temperature. Generally, the activating temperature is at least about 140° C. or greater. In different embodiments, the activating temperature is about or at least 140° C., 150° C., 160° C., 170° C., 180° C., 190° C., 200° C., 210° C., 220° C., 230° C., 240° C., 250° C., 260° C., or greater, or within a range bounded by any two of these temperatures. In various embodiments, the thermal base generator is a compound containing one or more groups selected from amides, sulfonamides, imides, imines, O-acyl oximes, benzoyloxycarbonyl derivatives, quarternary ammonium salts, and nifedipines, examples of which include o-{(β-(dimethylamino)ethyl)aminocarbonyl}benzoic acid, o-{(γ-(dimethylamino)propyl)aminocarbonyl}benzoic acid, 2,5-bis{(β-(dimethylamino)ethyl)aminocarbonyl}terephthalic acid, 2,5-bis{(γ-(dimethylamino)propyl)aminocarbonyl}terephthalic acid, 2,4-bis{(β-(dimethylamino)ethyl)aminocarbonyl}isophthalic acid, and 2,4-bis{(γ-(dimethylamino)propyl)aminocarbonyl}isophthalic acid.

The photoresist may also include a casting solvent to dissolve the components, so that the photoresist may be applied evenly on the substrate surface to provide a defect-free coating. Where the photoresist is used in a multilayer imaging process, the solvent used in the imaging layer may not be a solvent to the underlayer materials, otherwise unwanted intermixing may occur. The photoresist formulation may also include a surfactant. Surfactants may be used to improve coating uniformity, and may include ionic, non-ionic, monomeric, oligomeric, and polymeric species, or combinations thereof. Examples of some surfactants include fluorine-containing surfactants, such as the FLUORAD™ series available from 3M Company, and siloxane-containing surfactants such as the SILWET™ series available from Union Carbide Corporation.

After depositing the photoresist film on the substrate coated with the crosslinked SiARC, the photoresist film is patterned by any of the methods known in the art to form a latent image. In methods generally known in the art, the patterning process first involves exposing the photoresist film to radiation that activates the photoreactive component to cause a difference in solubility, with respect to the developer, between those portions of the photoresist film that have been exposed and those portions that have not been exposed. In particular embodiments, radiative exposure causes a crosslinking reaction to occur in the photoresist film, which causes insolubility of the exposed portions.

In a typical exposure process, a radiation or particle beam source projects radiation or energetic particles through a patterned mask onto the film disposed on the substrate. The mask may have a pattern of masked sections that are essentially opaque to the radiation or impenetrable to the energetic particles, as well as unmasked sections that are essentially transparent to the radiation or penetrable to the energetic particles. Radiation or energetic particles passing through the unmasked sections are transmitted to the film to be absorbed in the exposed regions of the film, wherein the radiation or particles activate a photoreactive component (e.g., photoacid) in the exposed regions of the film. In the event a photoacid is used, unexposed regions of film do not produce an acid. Exposure to the radiation or energetic particles typically renders the exposed regions soluble in a developer.

The photoresist may be pattern-wise imaged using electromagnetic radiation, such as ultraviolet (UV), deep-ultraviolet (DUV), or extreme-ultraviolet (EUV) radiation. Some particular UV wavelengths that may be employed, include, for example, approximately 436 nm or 365 nm. Some particular DUV wavelengths that may be employed include, for example, approximately 257 nm, 248 nm, 193 nm, and 157 nm. Some particular EUV wavelengths that may be employed include, for example, approximately 4 nm to approximately 70 nm, such as approximately 13 nm, x-ray, or a combination of these. Other wavelengths of radiation may be used, such as 313 nm, 334 nm, 405 nm, or 126 nm, particularly when the radiation source is a mercury emission source or wavelength-specific laser. For high performance lithography, single wavelength and/or narrow band radiation sources may be used. For less stringent conditions, a broad band multiple wavelength source may be used. The photoresist may also be pattern-wise imaged using particle radiation, such as electron beam or ion beam. The appropriate radiation or particle beam often depends to a large extent on the particular components in the photoresist composition.

After exposure, the latent image of the photoresist film is developed to form a patterned photoresist layer having a relief image therein. The developing step is typically achieved by contacting the exposed photoresist to a basic solution, where the base-soluble regions of the film are removed from the film to form a first patterned film. The developer may be organic or aqueous-based. A particular aqueous base developer considered herein is an aqueous solution of tetramethylammonium hydroxide (TMAH). Typically, before developing the photoresist film, the film is post-exposure baked at, for example, 90° C., 100° C., 110° C., 120° C., 130° C. or 140° C., for 20, 30, 40, 50, 60, 70, 80, 90, 100, 110 or 120 seconds.

The pattern from the photoresist layer may then be transferred to the exposed portions of underlying material layer of the substrate by etching with a suitable etchant using techniques known in the art. Preferably, the transfer is achieved by reactive ion etching or by wet etching. Once the desired pattern transfer has taken place, any remaining photoresist may be removed using conventional stripping techniques. Alternatively, the pattern may be transferred by ion implantation to form a pattern of ion implanted material.

After transferring the pattern to the substrate, the crosslinked SiARC is removed by contacting the crosslinked SiARC with an aqueous acid solution. The aqueous acid solution is typically a concentrated mineral acid, such as sulfuric acid, nitric acid, or a hydrohalide, such as HCl, HBr, or HI. By "concentrated" is generally meant a concentration of at least 1 molar (1 M). In different embodiments, the concentration of the acid in the aqueous acid solution is precisely, about, at least, above, up to, or less than, for example, 1, 2, 3, 4, 5, 6, 7, 8, 9, 10, 11, 12, 13, 14, 15, 16, 17, or 18 M, or up to the maximum practical or allowable aqueous concentration, which differs for each acid. Generally, the crosslinked SiARC is removed in the absence of peroxides (e.g., hydrogen peroxide and organic peroxides) and fluorides (e.g., HF and fluorinated hydrocarbons and carboxylic acids). Since removal of the crosslinked SiARC is conducted under acidic conditions, bases (e.g., ammonium hydroxides and amines) are excluded. The amount of time required for the aqueous acid solution to remove all of the crosslinked SiARC is dependent on such factors as the acid strength and composition of the crosslinked SiARC. Nevertheless, in typical embodiments, conditions are selected that minimize the time required for complete removal, such as a time for removal of up to or less than 10, 5, 4, 3, or 2 minutes, or up to or less than 1 minute.

Examples have been set forth below for the purpose of illustration and to describe certain specific embodiments described in the instant application. However, the scope set forth in this application is not to be in any way limited by the examples set forth herein.

The following examples are intended to provide those of ordinary skill in the art with a complete disclosure and description of how to prepare and use the compositions disclosed and claimed herein. Efforts have been made to ensure accuracy with respect to numbers (e.g., amounts, temperature, etc.), but allowance should be made for the possibility of errors and deviations. Unless indicated otherwise, parts are parts by weight, temperature is in ° C., and pressure is at or near atmospheric. Additionally, all starting materials were obtained commercially or were synthesized using known procedures.

Where appropriate, the following techniques and equipment were utilized in the Examples: $^1$H and $^{13}$C NMR spectra were obtained at room temperature on an Avance® 400 spectrometer. Quantitative $^{13}$C NMR was run at room temperature in acetone-$d_6$ in an inverse-gated $^1$H-decoupled mode using Cr(acac)$_3$ as a relaxation agent on an Avance® 400 spectrometer. Thermo-gravimetric analysis (TGA) was performed at a heating rate of 5° C./min in $N_2$ on a TA Instrument Hi-Res TGA 2950 Thermogravimetric Analyzer. Differential scanning calorimetry (DSC) was performed at a heating rate of 10° C./min on a TA Instruments® DSC 2920 modulated differential scanning calorimeter. Molecular weights were measured in tetrahydrofuran (THF) on a Waters Model® 150 chromatograph relative to polystyrene standards. IR spectra were recorded on a Nicolet® 510 FT-IR spectrometer on a film cast on a KBr plate.

Example 1

Synthesis of Octa(hydroxynorbornyl)octasilane POSS (Structure X)

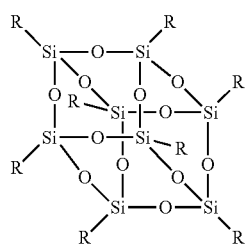

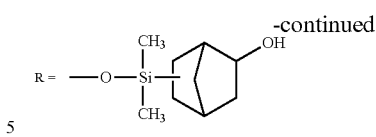

Octakis(dimethylsilyloxy)silsesquioxane ($Q_8M_8^H$) (2.54 grams, 0.0025 mole), 5-norbornen-2-ol, mixture of endo and exo, (2.25 g, 0.0205 mole), and tetrahydrofuran (THF) (20 ml) were placed in a round bottom flask equipped with a magnetic stirrer, nitrogen inlet, and a water condensor. Platinum(0)-1,3-divinyl-1,1,3,3-tetramethyldisiloxane complex in xylene (1 ml) was added to this mixture and stirred at room temperature for two hours. The reaction was complete at this time as determined by the IR spectrum of a thin film of the mixture on a sodium chloride plate. This solution was added dropwise into 400 mL hexanes. The product coagulated and was separated by decantation. It was rinsed twice with 100 mL hexanes and dried under vacuum at 60° C. for 18 hours to give 3.29 grams of a brown solid. The GPC of the material showed a major peak with $M_w$=1579 and PDI=1.02. In addition, there was a small fraction (16%) with $M_w$=3678 and PDI=1.07, believed to be a dimer of the desired product. The material is not soluble in 0.263N TMAH developer.

Example 2

Synthesis of Polycarbomethylsilane Partially Substituted with 2-Propylphenol (Structure Y)

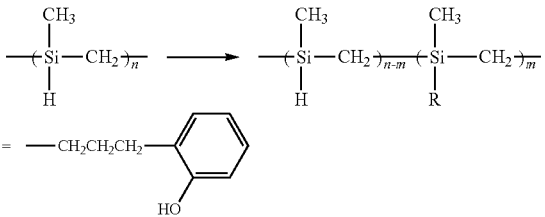

Polycarbomethylsilane (Aldrich, $M_w$~800) (2.32 g) and 2-allylphenol (10.7 g, 0.08 mole) were placed in a round bottom flask equipped with a magnetic stirrer, nitrogen inlet, and a water condenser. Platinum(0)-1,3-divinyl-1,1,3,3-tetramethyldisiloxane complex in xylene (0.50 ml) was added to this mixture and heated at 80° C. for 24 hours. Afterwards, the solution was allowed to cool to room temperature, diluted with 25 mL acetone and added dropwise into 800 mL 1:1 DI water/methanol mixture. The polymer coagulated and was separated by decantation. This polymer was then dissolved in 80 mL acetone and added dropwise into 800 mL 1:1 DI water/methanol mixture and stirred overnight. The coagulated polymer was separated by decantation, stirred with 300 mL DI water, and filtered through a frit funnel and suction dried for 1 hour. This polymer was then dried under vacuum at 50° C. for 18 hours. Yield: 4.50 grams. $M_w$=2900, PDI=1.8. NMR data indicated that about 45% of the hydrogen had been substituted. The polymer was found to be not soluble in 0.263N TMAH developer.

Example 3

POSS-Derived SiARC Coating

SiARC-1 film was prepared by dissolving 0.35 g of POSS polymer, as described in Example 1, 0.035 g of divinyltriethyleneglycol and 0.02 g of triethylammonium nonaflate in 3 g of propyleneglycol monomethylether acetate and 6.7 g cyclohexanone, subsequent filtration, spin-coating of the solution onto an 8" wafer, and post-apply baking at 220° C. for 60 seconds.

The crosslinked SiARC-1 (24% Si) dissolved in 18M concentrated $H_2SO_4$ within 1 minute at room temperature, while a commercially available formulation SHB-A629 (ShinEtsu, 17%) only broke up under the action of $H_2SO_4$ after three minutes and left SiARC flakes on the wafer after 20 minutes. The commercially available SiARC DUO™-248 (Honeywell EM, 30% Si) did not visibly react with $H_2SO_4$ at all after 20 minutes.

Thus, several advantageous lithographic features have been demonstrated with the SiARC-1 formulation:
- it is cross-linked and resistant to typical photoresist solvents like PGMEA, cyclohexanone or VT7000 after a post-apply bake (PAB) of 220° C./60 s;
- it forms a smooth film with good adhesive properties to commercially available photoresists;
- this film is also insoluble in aqueous 0.26N TMAH developer;
- photoresists can be patterned on the SiARC-1 film;
- after stripping the photoresist with organic solvent, the SiARC-1 film did not exhibit any difference in the area where the photoresist was exposed and TMAH-developed.

Example 4

Polycarbomethylsilane-Derived SiARC

In this example, polycarbomethylsilane modified with 45 mole % of propylphenol as described in Example 2 was used as a main resin and combined with around 11 wt % (relative to the polymer) of the tri-vinyl ether tris[(4-vinyloxy)butyl] trimellitate in PGMEA to give a SiARC solution with a solid content of about 1.8%. The solution was spin-coated on Si wafer, and the coated film was then baked at 220° C. for 60 seconds. The baked film had a thickness of 37.02 nm, and after 20 seconds of PGMEA rinse, the film had a thickness of 36.59 nm. This experiment demonstrates that the SiARC film is resistant to resist casting solvent, thus fulfilling a key requirement for SiARC application. As a further test, resistance to a commercial solvent, VT7000 organic solvent mixture (butyl acetate/gamma-butyrolactone 70:30), was analyzed by using VT7000 as a pre-rinse solvent on the coated film for 20 seconds. Excellent VT7000 resistance was demonstrated with minor film change from 37.0 nm before rinse and 36.6 nm after rinse. Significantly, by contacting the film with $H_2SO_4$ for about 1 minute, the film became completely dissolved.

In a separate experiment, polycarbomethylsilane modified with 45 mole % of propylalcohol as described in Example 2 was used as a main resin. The solid content was around 4.4% and X-linker was about 10% trivinylether. The bake temperature was 220° C. for about 60 seconds. The film had a thickness of about 845 Å. The film was rinsed with VT7000 for about 20 seconds. A minor film loss of about 3 nm was found. The film thickness after rinse was around 815 Å. Again, significantly, by contacting the film with $H_2SO_4$ for about 1 minute, the film became completely dissolved.

While there have been shown and described what are at present considered the preferred embodiments of the present application, those skilled in the art may make various changes and modifications which remain within the scope of the present application defined by the appended claims.

What is claimed is:

1. A layered structure comprising a substrate layer, a photoresist layer, and a crosslinked silicon-containing antireflective film between said substrate layer and photoresist layer, said crosslinked silicon-containing antireflective film comprising aqueous insoluble silsesquioxane units interconnected by acetal or ketal groups, wherein said silsesquioxane units and acetal or ketal groups are interconnected by bicycloalkyl or tricycloalkyl linking groups.

2. The antireflective film of claim 1, wherein said antireflective film has a thickness of up to 100 nm.

3. The method of claim 1, wherein said bicycloalkyl or tricycloalkyl linking groups comprise norbornyl groups.

4. A method for producing a crosslinked silicon-containing antireflective coating on a substrate, the method comprising:
   (a) coating a substrate with a silicon-containing antireflective coating formulation comprising:
      (i) an aqueous base insoluble silsesquioxane component having a multiplicity of bicycloalkyl or tricycloalkyl hydrocarbon groups derivatized with hydroxy groups in the absence of Si—O—C and Si—O—H moieties;
      (ii) a vinylether component having a multiplicity of vinylether groups; and
      (iii) a casting solvent; and
   (b) heating the coated substrate at a temperature of at least 200° C. and up to 300° C. to effect crosslinking between the silsesquioxane component and vinylether component to result in a crosslinked silicon-containing antireflective coating comprised of aqueous base insoluble silsesquioxane units interconnected by acetal or ketal groups.

5. The method of claim 4, wherein said silicon-containing antireflective coating formulation further comprises a thermal acid generator.

6. The method of claim 4, wherein said vinylether component has the formula:

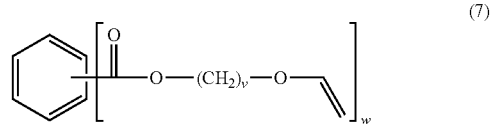

(7)

wherein v is an integer from 2 to 12 and w is an integer from 3 to 6.

7. The method of claim 4, wherein said vinylether component has the formula:

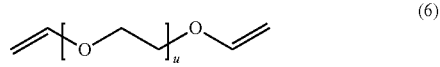

(6)

wherein u is an integer of 3 to 12.

8. The method of claim 4, wherein said temperature is at least 210° C. and up to 300° C.

9. The method of claim 4, wherein said silicon-containing antireflective coating formulation further comprises an activatable acid generator.

10. The method of claim 9, wherein said activatable acid generator is a thermal acid generator.

11. The method of claim 4, further comprising overlaying said crosslinked silicon-containing antireflective coating with a layer of photoresist.

12. The method of claim 4, wherein said bicycloalkyl or tricycloalkyl hydrocarbon groups comprise norbornyl groups.

* * * * *